(12) United States Patent
Raineri et al.

(10) Patent No.: US 6,762,112 B2
(45) Date of Patent: Jul. 13, 2004

(54) METHOD FOR MANUFACTURING ISOLATING STRUCTURES

(75) Inventors: Vito Raineri, Mascalucia (IT); Mario Saggio, Aci Castello (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 10/079,925

(22) Filed: Feb. 20, 2002

(65) Prior Publication Data

US 2003/0003680 A1 Jan. 2, 2003

(30) Foreign Application Priority Data

Feb. 20, 2001 (IT) ..................................... MI2001A0339

(51) Int. Cl.[7] .............................................. H01L 21/76
(52) U.S. Cl. ........................................................ 438/424
(58) Field of Search ................................ 438/400, 410, 438/421, 423, 424, 439, 440, 442, 570, 572; 257/594, 626

(56) References Cited

U.S. PATENT DOCUMENTS 5,270,244 A * 12/1993 Baliga ........................ 438/440

FOREIGN PATENT DOCUMENTS

| EP | 0363944 | 4/1990 | ......... H01L/21/473 |
| EP | 0845803 | 6/1998 | ......... H01L/21/205 |

OTHER PUBLICATIONS

Wolf, Silicon Processing for the VLSI Era, vol. 2: Process Integration, Lattice Press, 1990, p. 45.*

* cited by examiner

*Primary Examiner*—Evan Pert
(74) *Attorney, Agent, or Firm*—Lisa K. Jorgenson; Allen, Dyer, Doppelt, Milbrath & Gilchrist, P.A.

(57) ABSTRACT

A method for forming isolating structures in a silicon carbide layer includes depositing a masking layer on first and second portions of the silicon carbide layer, and forming openings through the masking layer to expose the first portions of the silicon carbide layer. Ions are implanted into the first portions of the silicon carbide layer. The silicon carbide layer is heated to form an oxide layer thereon having first portions on the first portions of the silicon carbide layer, and having second portions on the second portions of the silicon carbide layer. The first portions of the oxide layer are etched to form isolating regions in the silicon carbide layer.

19 Claims, 5 Drawing Sheets

METHOD FOR MANUFACTURING ISOLATING STRUCTURES

FIELD OF THE INVENTION

The present invention relates to semiconductor processing, and more particularly, to a method for manufacturing isolating structures in a substrate. The substrate is particularly, but not exclusively, silicon carbide, and reference will be made throughout this description to this field of application for convenience of illustration.

BACKGROUND OF THE INVENTION

Silicon carbide is an extremely resistant material to chemical etching, as is well known to those skilled in the art. Removing a portion of silicon carbide by ordinary etching techniques as used in standard silicon-integrated circuit manufacturing processes is difficult. A method for etching away such layers is based on the use of a fluorine solution utilizing an especially dense plasma.

While being advantageous on several counts, this method has certain drawbacks. In particular, a hard mask layer must be used to define the areas to be removed. Defining the hard mask layer involves some serious resolution problems, and complicates the silicon carbide etching process.

SUMMARY OF THE INVENTION

In view of the foregoing background, an object of the present invention is to provide a method for manufacturing isolating structures in silicon carbide layers. This method is compatible with standard microelectronic device manufacturing techniques and is effective to overcome the limitations of the prior methods.

The principle on which this invention is based is one of "damaging" the areas of the silicon carbide layer to be removed by modifying the lattice structure of the silicon carbide layer using an ion implantation process, thereby making for faster and more efficient removal of such layers.

One aspect of the invention is directed to a method for forming isolating structures in a silicon carbide layer. The method comprises depositing a masking layer on first and second portions of a silicon carbide layer, forming openings through the masking layer to expose the first portions of the silicon carbide layer, and implanting ions into the first portions of the silicon carbide layer.

The silicon carbide layer is preferably heated to form an oxide layer thereon having first portions on the first portions of the silicon carbide layer, and having second portions on the second portions of the silicon carbide layer. The first portions of the oxide layer have a first thickness, and the second portions of the oxide layer have a second thickness less than the first thickness.

The method preferably further includes removing the oxide layer to form isolating regions in the first portions of the silicon carbide layer. Insulation material may be deposited in the isolating regions to form isolating structures. The masking layer may be removed before heating the silicon carbide layer. The ions may comprise heavy ions or a dopant.

Another aspect of the invention is directed to a method for forming isolating trenches for an epitaxially grown diode. The method preferably comprises forming a first epitaxial layer having a first type of conductivity on a silicon carbide layer, and forming a second epitaxial layer having a second type of conductivity on the first epitaxial layer. A masking layer is formed on the second epitaxial layer, and openings are formed through the masking layer to expose first portions of the second epitaxial layer.

The method preferably further comprises removing the first portions of the second epitaxial layer to expose first portions of the first epitaxial layer, and implanting ions into the first portions of the first epitaxial layer. The first and second epitaxial layers and the silicon carbide layer are heated to form an oxide layer having first portions on the first portions of the first epitaxial layer, and having second portions on the second epitaxial layer.

The first portions of the oxide layer have a first thickness, and the second portions of the oxide layer have a second thickness less than the first thickness. The oxide layer may be removed to form isolating trenches in the first portions of the first and second epitaxial layers. Insulation material may be deposited in the isolating trenches.

Yet another aspect of the invention is directed to a method for isolating an edge of an epitaxially grown diode. After the isolating trenches have been formed as discussed above for the epitaxially grown diode, a ring mask is formed on a peripheral portion of the isolating trenches. Ions are implanted into the isolating trenches to form an implanted region in the first epitaxial layer that extends across a bottom and sidewalls of the trench adjacent the ring mask for isolating the edge of the epitaxially grown diode.

The method preferably further includes removing the ring mask, and heating the first and second epitaxial layers and the silicon carbide layer to form a second oxide layer on the trench and on the second epitaxial layer. A portion of the second oxide layer on the second epitaxial layer may be removed.

BRIEF DESCRIPTION OF THE DRAWINGS

The features and advantages of the inventive method will be apparent from the following description of an embodiment thereof, given by way of a non-limitative example with reference to the accompanying drawings. In the drawings.

DETAILED DESCRIPTION OF THE PREFERRED EMBODIMENTS

Figure 1:
FIGS. 1 to 6 illustrate a first embodiment of the method according to the present invention.
Figure 2:
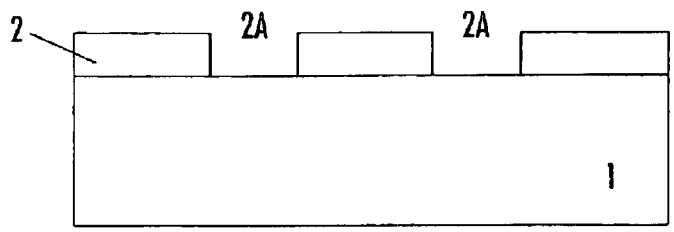
Figure 3:
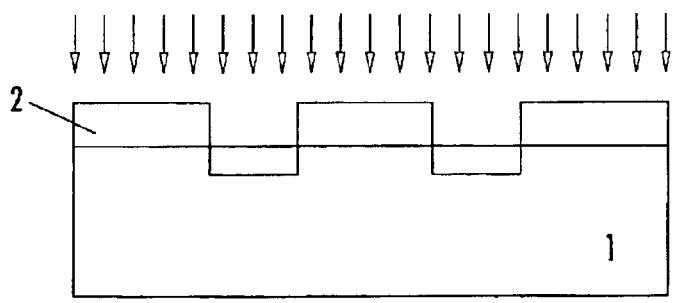
Figure 4:
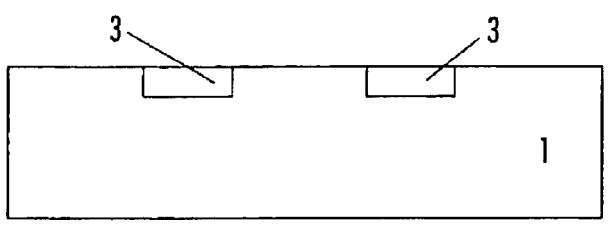
Figure 5:
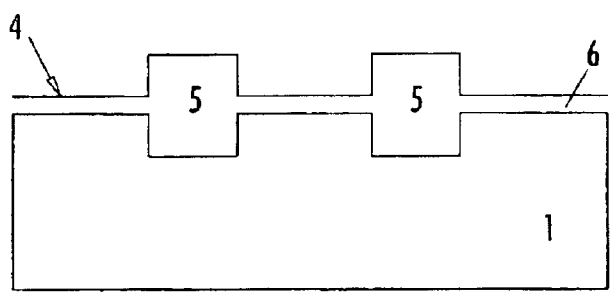
Figure 6:
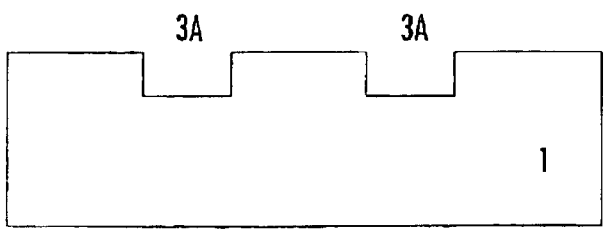
Figure 7:
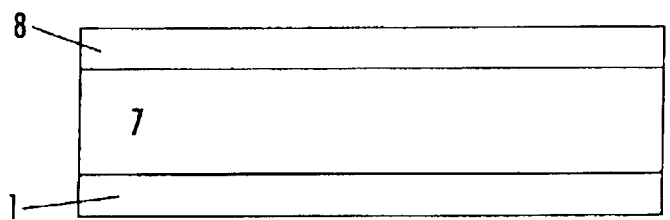
FIGS. 7 to 13 illustrate a second embodiment of the method according to the present invention.
Figure 8:
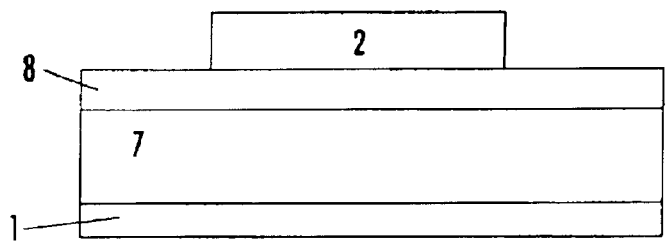
Figure 9:
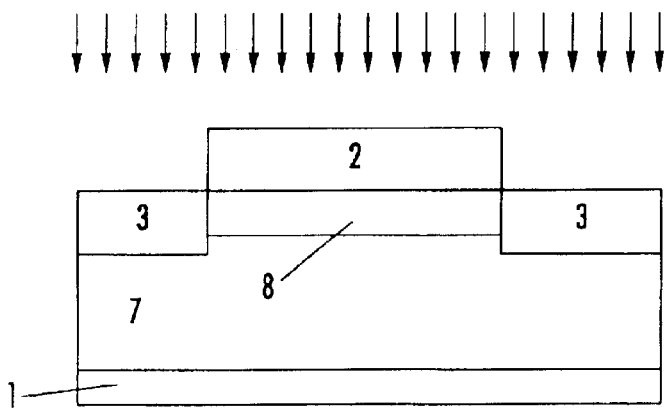
Figure 10:
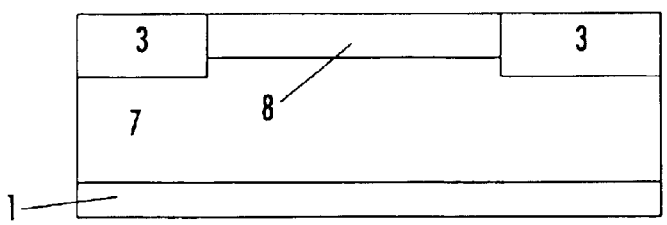

With reference to FIGS. 1 to 6, a first embodiment of a method for manufacturing insulating structures, according to the invention, will now be described. The process steps and the structures described below do not form a complete process flow for manufacturing integrated circuits. In fact, this invention can be practiced jointly with integrated circuit manufacturing techniques currently used in the art, and only those common process steps will be discussed herein as are necessary for understanding the invention. The drawing figures which show cross-sections through a semiconductor wafer are not drawn to scale. They are drawn to highlight major features of the invention.

A masking layer 2 of a photoresist or metal, e.g., silicon oxide, is formed over the surface of a substrate 1 of silicon carbide (SiC). Openings 2A are formed through the masking layer 2 using conventional photolithographic techniques, and successive etching steps are performed for exposing the substrate portions where the isolating regions (trenches) 3A are to be formed.

In accordance with the invention, an ion implanting step is carried out to implant the chip surface with heavy ions or a dopant throughout. Thus, in the implanted regions 3 of the substrate 1 uncovered by the masking layer 2, the ion implanting step will result in the substrate 1 becoming "damaged", in the sense that its Si—C lattice structure undergoes alteration. Advantageously in the inventive method, the depth of the "damaged" regions 3 can be varied by changing parameters, such as energy and dosage of the ions being implanted.

After removing the masking layer 2 from the entire surface of the substrate 1, the whole substrate 1 is subjected to an oxidizing step. An oxide layer 4 is formed over the chip surface. As is known, during the heat treating process, a surface portion of the substrate 1 is also converted into the oxide layer 4.

In particular, the oxide layer 4 has a first portion 5 with a first thickness in the regions 3, while on the rest of the substrate 1 the oxide layer has a second portion 6 with a second thickness smaller than the first thickness. The difference is due to variations in the lattice structure of the implanted regions 3, generated during the ion implanting step. This causes the rate of oxidation of the silicon carbide layer to increase, and consequently, the oxide layer 4 to grow thicker.

Figure 21:
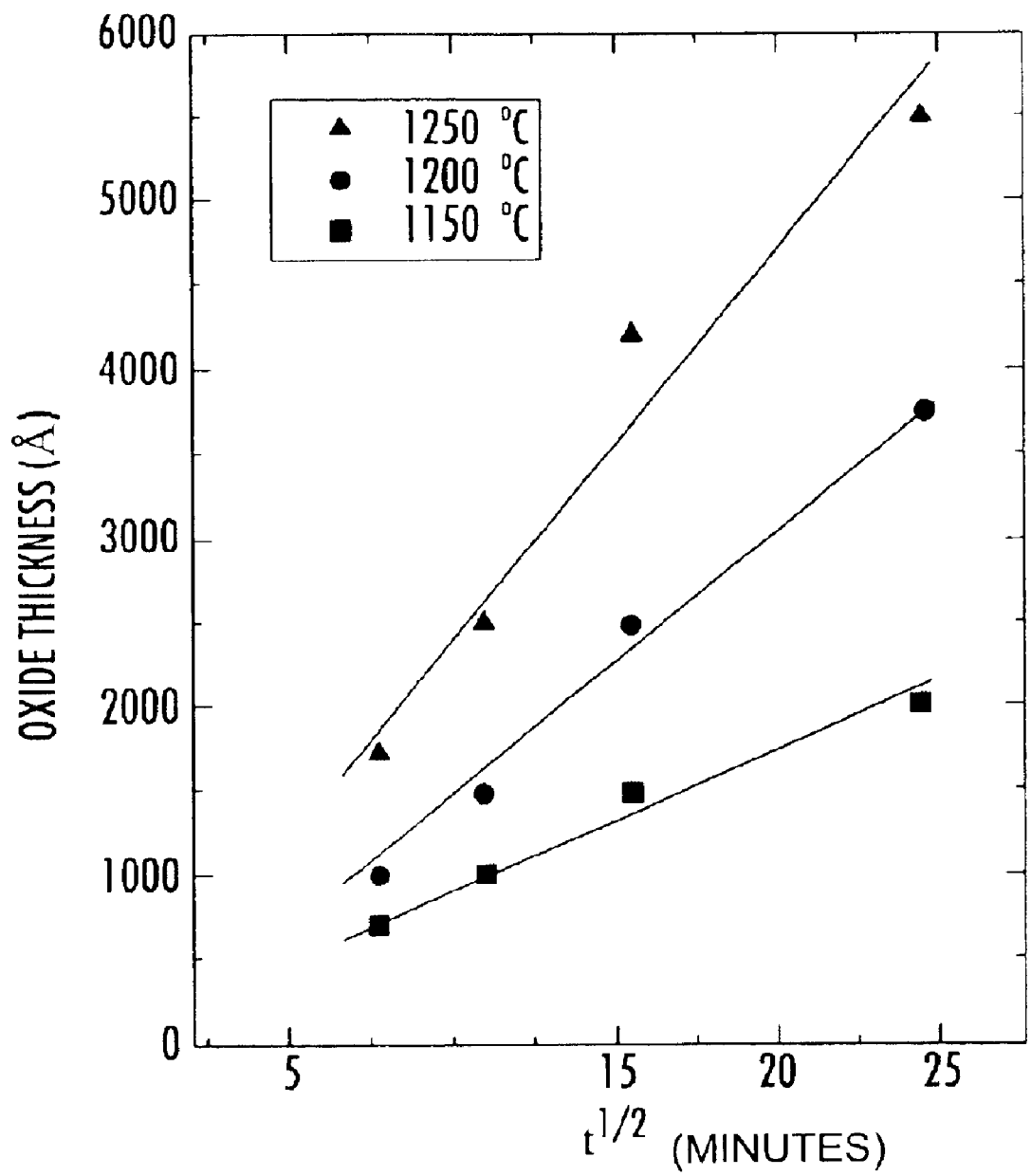
FIG. 21 is a graph showing the rate of growth of a SiC oxide layer plotted against time according to the present invention.

The process for thermally oxidizing the silicon carbide is extremely slow, as FIG. 21 illustrates. This figure shows a plot of the thickness of the oxide grown over SiC against time at different oxidation temperatures. Advantageously in this invention, the rate of oxidation increases substantially as ions are implanted in the SiC substrate 1.

For example, when silicon ions are implanted at 1 MeV and at a concentration of $5*10^{15}$ atoms/cm$^2$, with the oxidation process being conducted at 1150° C. for two hours in an $O_2$ atmosphere, the thickness of the oxide layer in the regions 3 is 2.5 μm, against an oxide layer that is 500 nm thick in the undamaged portion.

Under these conditions, the depth of the oxide layer in the substrate would be 1 μm when a conventional 1% fluorine technique is used. A step of removing the oxide layer from both the surface of the substrate 1 and the regions 3 results in isolating regions (trenches) 3A being defined depthwise in the substrate 1.

Advantageously in this invention, the isolating regions and their trenches are formed by etching through the layer of silicon oxide rather than the silicon carbide. Thus, standard removal operations, such as those provided in conventional integrated circuit manufacturing processes, can be carried out to form the trench regions 3A.

The method of this invention is especially advantageous where isolating trenches are to be formed for an epitaxially grown diode. This will now be described as a second application of the inventive method with reference to FIGS. 7 to 13. In the structure shown in these figures, identical elements with those of the structure previously illustrated are denoted by the same reference numerals.

A first epitaxial layer 7 is doped with impurities of the N-type at a relatively low dopant concentration, and a second epitaxial layer 8 is doped with P-type impurities at a relatively high dopant concentration. These layers are formed over the surface of a silicon carbide substrate 1. Advantageously, the second layer 8 is thinner than the first layer 7.

A masking layer 2 of a photoresist or metal or silicon oxide is formed over the second epitaxial layer 8. Using conventional photolithographic and etching techniques, the masking layer 2 is partially etched away to expose substrate portions where the isolating regions 3 will be formed.

Advantageously, the whole chip surface is ion implanted. In particular, heavy ions are implanted in the substrate portion where isolation is to be provided. As a consequence of the implantation, the structure of the layer 8 becomes "damaged" in the regions 3.

After removing the masking layer 2 from the entire surface of the substrate 1, the whole substrate 1 is subjected to an oxidizing step. Thus, an oxide layer 4 is formed, which has a first portion 5 with a first thickness in the regions 3, while in the epitaxial layer 8, it has a second portion 6 with a second thickness that is smaller than the first thickness.

Under these conditions, the depth of the first portion of the oxide layer 4 will be greater than the depth of the second epitaxial layer 8. Consequently, the second layer 8 is surface isolated from the edge of the structure and forms the anode of the diode. Advantageously, the oxide layer 4 can be removed completely and a suitable insulation material may be substituted.

An opening 4A is then formed through the oxide layer 4 such that at least a portion of the layer 8 is exposed. The diode manufacturing process is then completed by forming conventional metal layers 10. The method of this invention can also be applied to forming edge structures. For simplicity, a method of making an isolating structure for a diode as formed above will now be discussed with reference to FIGS. 7 to 13.

Figure 11:
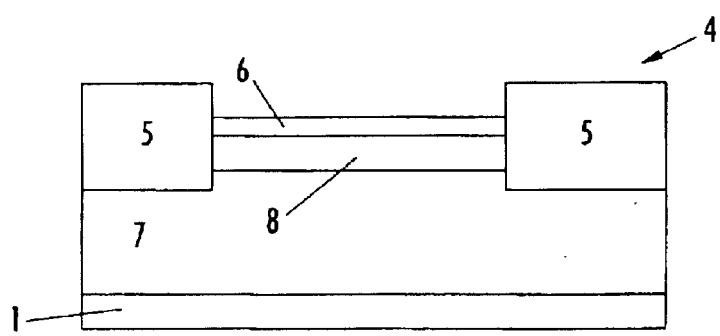
Figure 12:
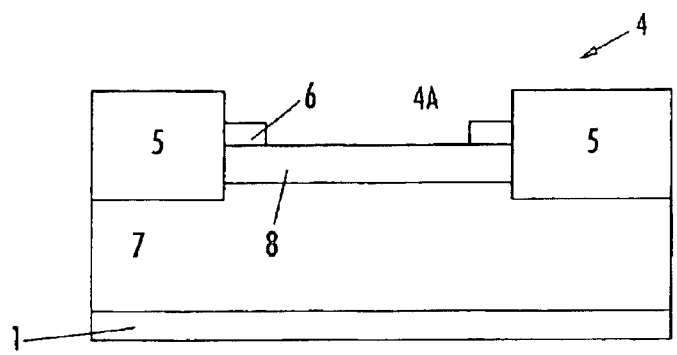
Figure 13:
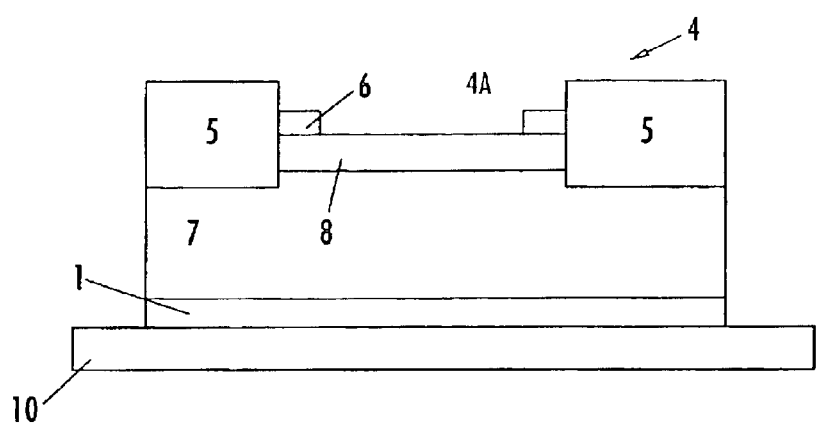
Figure 14:
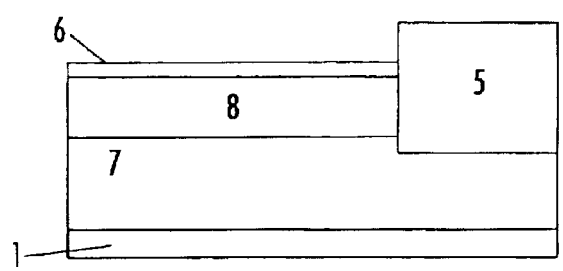
FIGS. 14 to 20 illustrate a third embodiment of the method according to the present invention.

In particular, the process for manufacturing such an edge structure will be described starting from the endpoint of the step shown in FIG. 11, corresponding to FIG. 14 that only shows the peripheral portion of layer 8, as shown in FIGS. 14 to 20.

Figure 15:
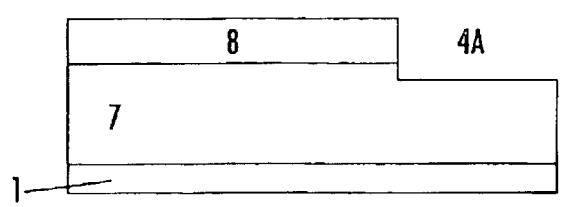
Figure 16:
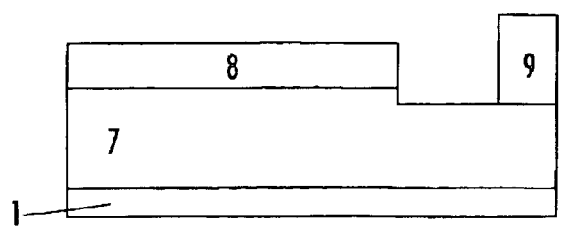
Figure 17:
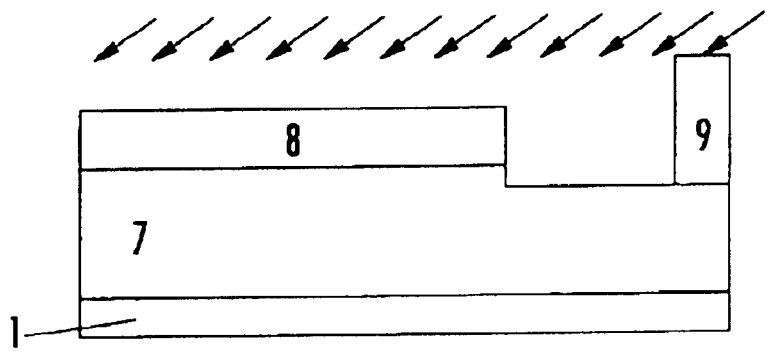
Figure 18:
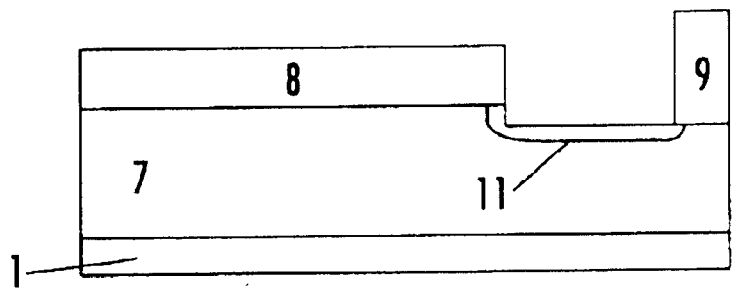
Figure 19:
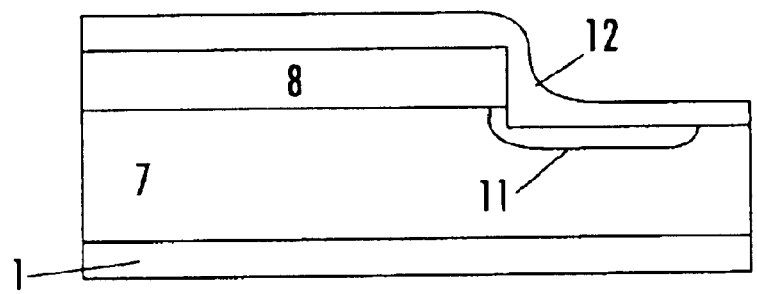
Figure 20:
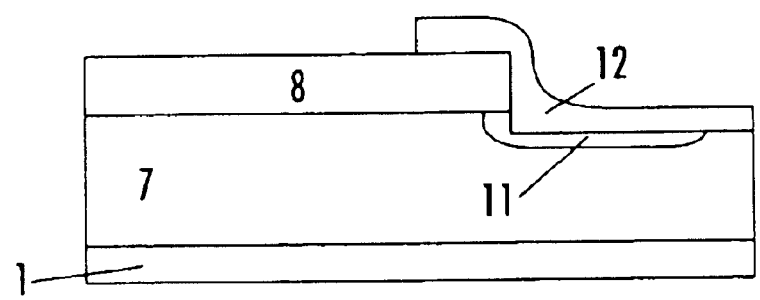

With reference to FIG. 15, the oxide layer 4 is removed completely to form a trench 4A. Subsequently, a mask 9, known as a ring mask, is formed on the chip edge. This is followed by an implanting step that affects the whole chip. Advantageously, this implantation is provided at an inclination angle effective to produce an implanted region 11 that extends across the bottom and the sidewalls of the trench 4A. After removal of the ring mask 9, the method comprises carrying out an oxidation process all over the chip to form an oxide layer 12 for diode edge isolation.

To summarize, when the method of this invention is applied, isolating structures or trenches can be formed in the layers of silicon carbide by standard integrated circuit manufacturing techniques. In particular, by providing for portions of a silicon carbide layer to be damaged, as by implantation with heavy ions or dopant ions, the inventive method effectively improves the rate of oxidation of the silicon carbide layer. As a result, the process of removing the oxidized carbide layer is compatible with standard removal techniques for integrated circuits, making for faster and more efficient removal operations.

That which is claimed is:

1. A method for forming isolating structures in a silicon carbide layer, the method comprising:

forming a masking layer on first and second portions of the silicon carbide layer;

forming openings through the masking layer to expose the first portions of the silicon carbide layer;

implanting ions into the first portions of the silicon carbide layer;

heating the silicon carbide layer to form an oxide layer thereon having first portions on the first portions of the silicon carbide layer and having second portions on the second portions of the silicon carbide layer, with the first portions of the oxide layer having a first thickness and the second portions of the oxide layer having a second thickness less than the first thickness;

removing the oxide layer to form isolating regions in the first portions of the silicon carbide layer; and depositing insulation material in the isolating regions to form isolating structures.

2. A method according to claim 1, further comprising removing the masking layer before heating the silicon carbide layer.

3. A method according to claim 1, wherein the ions comprise heavy ions for causing lattice damage when implanted in the silicon carbide layer.

4. A method according to claim 1, wherein the ions comprise a dopant.

5. A method for forming isolating trenches for an epitaxially grown diode, the method comprising:

forming a first epitaxial layer having a first type of conductivity on a silicon carbide layer;

forming a second epitaxial layer having a second type of conductivity on the first epitaxial layer;

forming a masking layer on the second epitaxial layer;

forming openings through the masking layer to expose first portions of the second epitaxial layer;

removing the first portions of the second epitaxial layer to expose first portions of the first epitaxial layer;

implanting ions into the first portions of the first epitaxial layer;

heating the first and second epitaxial layers and the silicon carbide layer to form an oxide layer having first portions on the first portions of the first epitaxial layer and having second portions on the second epitaxial layer, with the first portions of the oxide layer having a first thickness and the second portions of the oxide layer having a second thickness less than the first thickness; and removing the oxide layer to form the isolating trenches in the first portions of the first and second epitaxial layers.

6. A method according to claim 5, further comprising depositing insulation material in the isolating trenches.

7. A method according to claim 5, wherein the first epitaxial layer has a first thickness, and the second epitaxial layer has a second thickness less than the first thickness.

8. A method according to claim 5, further comprising removing the masking layer before heating the first and second epitaxial layers and the silicon carbide layer.

9. A method according to claim 5, wherein the ions comprise heavy ions for causing lattice damage when implanted in the silicon carbide layer.

10. A method according to claim 5, wherein the ions comprise a dopant.

11. A method according to claim 5, wherein the second epitaxial layer defines an anode of the diode.

12. A method for isolating an edge of an epitaxially grown diode, the method comprising:

forming a first epitaxial layer having a first type of conductivity on a silicon carbide layer;

forming a second epitaxial layer having a second type of conductivity on the first epitaxial layer;

forming a masking layer on the second epitaxial layer;

forming openings through the masking layer to expose first portions of the second epitaxial layer;

removing the first portions of the second epitaxial layer to expose first portions of the first epitaxial layer;

implanting ions into the first portions of the first epitaxial layer;

heating the first and second epitaxial layers and the silicon carbide layer to form an oxide layer having first portions on the first portions of the first epitaxial layer and having second portions on the second epitaxial layer, with the first portions of the oxide layer having a first thickness and the second portions of the oxide layer having a second thickness less than the first thickness; and removing the oxide layer to form isolating trenches in the first portions of the first and second epitaxial layers;

forming a ring mask on a peripheral portion of the isolating trenches; and implanting ions into the isolating trenches to form an implanted region in the first epitaxial layer that extends across a bottom and sidewalls of the trench adjacent the ring mask for isolating the edge of the epitaxially grown diode.

13. A method according to claim 12, further comprising:

removing the ring mask; and heating the first and second epitaxial layers and the silicon carbide layer to form a second oxide layer on the trench and on the second epitaxial layer.

14. A method according to claim 13, further comprising removing a portion of the second oxide layer on the second epitaxial layer.

15. A method according to claim 12, wherein the first epitaxial layer has a first thickness, and the second epitaxial layer has a second thickness less than the first thickness.

16. A method according to claim 12, further comprising removing the masking layer before heating the first and second epitaxial layers and the silicon carbide layer silicon carbide layer.

17. A method according to claim 12, wherein the ions comprise heavy ions for causing lattice damage when implanted in the silicon carbide layer.

18. A method according to claim 12, wherein the ions comprise a dopant.

19. A method according to claim 12, wherein the second epitaxial layer defines an anode of the diode.

* * * * *